United States Patent
Moon et al.

(10) Patent No.: US 7,551,909 B1
(45) Date of Patent: Jun. 23, 2009

(54) CMOS TRANSCEIVER WITH DUAL CURRENT PATH VCO

(75) Inventors: Yongsam Moon, Cupertino, CA (US); Young Soo Park, Sunnyvale, CA (US); Deog-Kyoon Jeong, Kwanak-Gu (KR)

(73) Assignee: Silicon Image, Inc., Sunnyvale, CA (US)

( * ) Notice: Subject to any disclaimer, the term of this patent is extended or adjusted under 35 U.S.C. 154(b) by 725 days.

(21) Appl. No.: 10/651,500

(22) Filed: Aug. 29, 2003

Related U.S. Application Data (60) Provisional application No. 60/406,858, filed on Aug. 29, 2002.

(51) Int. Cl.
*H04B 1/06* (2006.01)

(52) U.S. Cl. .................. 455/260; 455/208; 455/333; 375/345; 331/19

(58) Field of Classification Search ............. 455/76, 455/765.1, 783.1, 780.3, 255–260, 205, 208, 455/323, 333; 375/303, 307, 324, 327; 331/16, 331/18, 19
See application file for complete search history.

(56) References Cited

U.S. PATENT DOCUMENTS

| | | | | |
|---|---|---|---|---|
| 4,755,774 A | * | 7/1988 | Heck | ........................ 332/123 |
| 5,319,680 A | * | 6/1994 | Port et al. | ................... 375/375 |
| 5,963,057 A | * | 10/1999 | Schmitt et al. | .............. 326/103 |
| 5,978,688 A | * | 11/1999 | Mullins et al. | .............. 455/557 |
| 6,462,623 B1 | * | 10/2002 | Horan et al. | .................. 331/17 |
| 6,714,087 B2 | * | 3/2004 | Sakurai et al. | ................. 331/57 |
| 2002/0038393 A1 | * | 3/2002 | Ganapathy et al. | ............ 710/22 |
| 2002/0079937 A1 | * | 6/2002 | Xanthopoulos | ............. 327/158 |
| 2003/0197537 A1 | * | 10/2003 | Saint-Laurent | ............. 327/165 |
| 2004/0160261 A1 | * | 8/2004 | Koch et al. | ................... 327/333 |
| 2005/0266817 A1 | * | 12/2005 | Welland et al. | ............. 455/260 |

* cited by examiner

*Primary Examiner*—Nhan T Le
(74) *Attorney, Agent, or Firm*—Perkins Coie LLP (57) ABSTRACT

A dual current path voltage controlled oscillator exhibits both the seamless frequency acquisition and uniform VCO gain reduction while preserving an original operating range and phase locked loop characteristics. The present invention provides a quad-channel transceiver comprising a phase locked loop circuit including a voltage controlled oscillator used to generate a clock signal, a FIFO buffer used to store data to be transmitted, a frequency comparator for comparing a reference clock to the generated clock signal from the phase locked loop circuit; and a folded starved inverter circuit contained within the voltage controlled oscillator wherein the folded starved inverter provides two current paths. The dual current paths allow for simultaneous coarse and fine phase tracking. With this low jitter performance and wide operating range, the quad transceiver may be implemented in 0.18-μm CMOS technology, and shows $10^{-12}$ bit error rate up to speeds of 3 Gbps.

13 Claims, 8 Drawing Sheets

CMOS TRANSCEIVER WITH DUAL CURRENT PATH VCO

CROSS REFERENCE TO RELATED APPLICATIONS

This application is related to and claims benefit from copending provisional application "A CMOS Transciever with Dual Current Path VCO" Ser. No. 60/406,858 filed Aug. 29, 2002, the complete contents of which are herein incorporated by reference.

BACKGROUND OF THE INVENTION

This invention relates generally to integrated circuits, and more particular to integrated circuits utilizing CMOS transceiver technology.

Tranceivers (transmitters/receivers) are used in integrated circuits to communicate with circuitry off and/or on the integrated circuit chips. However, transceivers of the prior art tend to be rather complex, which increases the "footprint" on the integrated circuit chip. Prior art transceivers also have power, performance and cost issues.

Considerable research effort has focused on implementing the physical layers of Gigabit Ethernet, Fibre Channel, IEEE 1394, network switch, etc. The major goal is to give the physical layer a high bandwidth transmission for digital data over a long cable with a low bit error rate (BER). As more transceivers operate at higher frequencies and over longer cables, the signal frequencies tend to come close to the channel bandwidth. Bandwidth limitation in the channel causes signal degradation, in the form of inter-symbol interference (ISI). Signal degradation shows up in the eye diagram as eye-closure: the center of the eye is smaller in both time and signal amplitude. Eye-closure causes higher BER since it restricts successful data-detection to a smaller time interval.

According to IEEE std 802.3z, Gigabit Ethernet standard, the receiver shall operate if the total jitter of data transition is less than 71% of the bit time, where deterministic jitter takes up 45% and random jitter, 26%. Deterministic jitter is also referred to as systematic jitter and is caused mostly by ISI and duty-cycle distortion. Random jitter is also referred to as nonsystematic jitter and is generated by a number of noise sources such as thermal noise, power supply noise, substrate noise, etc. Random jitter is Gaussian in nature, while deterministic jitter is due to non-Gaussian events.

Random jitter is generated in both the transmitter and receiver. A transmitter clock is generated by a transmitter-side phase locked loop (PLL) or delay locked loop (DLL). Since this clock switches the serializer, the outgoing data stream inherits the jitter component of the PLL or DLL generated clock. The receiver clock samples the data with its own jitter component. Thus, the equivalent jitter is the sum of both jitter components. As the transceiver operates at higher frequencies and the bit time becomes shorter, the random jitter will occupy a greater portion of the bit time and then the eye opening will narrow. Therefore, for a lower BER, jitter should be reduced in both the transmitter and receiver as the frequency increases.

In general, a clock recovery circuit takes a sequence of times at which a transition edge of a pulse crosses some threshold voltage and averages the times to extract the real input pulse timing. This averaging process makes the clock recovery circuit tolerant to input jitter. Jitter tolerance is a very critical requirement for clock recovery circuits. With the same circuit and process the jitter tolerance will be dependent on the transceiver architecture.

Currently, many transceivers are designed to be a macrocell of an ASIC standard cell library as well as a stand-alone component. Thus, both small area and low power consumption become essential in the transceiver design. In order to measure the BER of a transceiver in an operating frequency, a test board with a small number of field programmable gate array (FPGA) chips is required. The FPGA in the transmitter side generates an appropriate bit sequence, and that in the receiver monitors the sequence and measures the BER. If built-in self-test (BIST) capability is included on chip, this will take the place of the FPGAs. The BIST can lower the test cost and cover the entire frequency range of the transceiver. As mentioned above, when designing a high-speed transceiver with a low BER, jitter reduction and jitter tolerance of the architecture are the most important design issues. Low power consumption, small chip area, and testability are also design concerns. In these types of systems, the PLL and a voltage controlled oscillator (VCO) within the PLL are known sources that produce jitter to the clock signals.

For a given tuning range of a VCO, as the chip supply voltage scales down with technology advancement, a VCO gain ($K_v$) grows larger. However, too large a $K_v$ induces detrimental problems in a PLL, while also causing large jitter and a narrow pumping current range. In a realistic phase detector and charge pump design, the control voltage of a VCO is disturbed by parasitic currents due to coupling and charge sharing. So, a large $K_v$ induces a large jitter. Also, since the current range of a charge pump is inversely proportional to $K_v$, a large $K_v$ makes the pumping current range narrow, possibly causing instability in varying PVT conditions.

It would therefore be desirable to provide an integrated circuit transceiver that has a small footprint, operates at high frequencies, and which has superior power, performance and cost advantages over transceivers of the prior art. It is also desirable to reduce jitter produced by the transceiver components.

SUMMARY OF INVENTION

A quad-channel design of the present invention exhibits power, performance, and cost advantages and offers a small footprint in many high bandwidth communication systems such as Gigabit Ethernet, Fibre Channel, network switch, etc. While sharing a single phase-locked loop (PLL) among multiple channels requires chip-wide clock distribution and potentially causes clock-waveform distortion, a local PLL dedicated to each channel alleviates clock-distribution problem. However, inter-channel noise coupling must be minimized with a careful power/ground design in both die and BGA-package levels.

In the quad design of a preferred embodiment with 8 independent PLLs, compared with a 2.5-V design, the tuning range of a voltage-controlled oscillator (VCO) is sufficiently wider, thereby guaranteeing correct operation in extremely varying process, voltage, and temperature (PVT) conditions. Furthermore, unlike a conventional VCO with a similar supply voltage (1.8 V) and tuning range, which has too large a VCO gain ($K_v$), this low jitter transceiver incorporates a $K_v$ reduction technique and thus exhibits low jitter performance.

Therefore one embodiment of the present invention provides a quad-channel transceiver comprising a phase locked loop circuit including a voltage controlled oscillator used to generate a clock signal, a FIFO buffer used to store data to be transmitted, a frequency comparator for comparing a reference clock to the generated clock signal from the phase locked loop circuit; and a folded starved inverter circuit contained within the voltage controlled oscillator wherein the folded starved inverter provides two current paths.

Using the above structures, one method of the present invention for operating a quad-channel transceiver comprises providing data to be transmitted into a FIFO buffer, providing clock signals using a phase locked loop and voltage controlled oscillator circuits, providing a plurality of delayed clock signals, and transmitting data using clock signals produced from a folded starved inverter circuit contained within the voltage controlled oscillator circuit.

These and other advantages of the present invention will become apparent to one skilled in the art upon a reading of this specification and a study of the drawings.

BRIEF DESCRIPTION OF THE DRAWINGS

FIG. 10(b) is a transmitter (Tx) output eye diagrams at 3 Gbps with pre-emphasis medium on.

DETAILED DESCRIPTION OF THF PREFERRED EMBODIMENTS

Figure 1A:
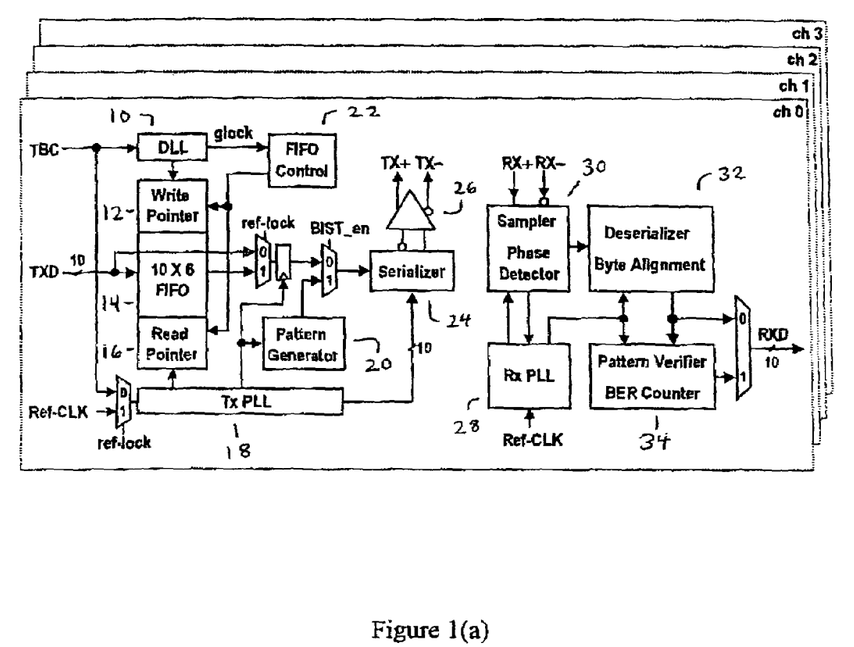
FIG. 1(a) is a transceiver block diagram.

FIG. 1(a) shows a block diagram of one channel of the quad transceiver A delay locked loop (DLL) 10, is operatively connected to a write pointer 12, a 10×6 FIFO buffer 14, a read pointer 16, and a FIFO controller 22 on the transmitter side of the transceiver. Also shown are a transmitter phase locked loop (TxPLL) 18, a pattern generator 20, a serializer 24, and an output amplifier 26. In this embodiment the TxPLL 18 provides multiphase clocks to a serializer 24 and an additional clock to the other digital circuits. Since the transmit byte clock (TBC) and transmit data signals (TXD) have a predetermined phase relationship, if TBC is selected as the TxPLL input, the TXD signal can bypass a first-in/first-out (FIFO) circuit, thereby reducing the latency. However, since the TBC is provided by an ASIC protocol-device, it has a potentially larger jitter than a reference clock Ref-CLK. The receive portion contains a sampler phase detector 30, a receive phase locked loop (RxPLL) 28, a deserializer byte aligner 32, and a pattern verifier BER counter 34.

Figure 1B:
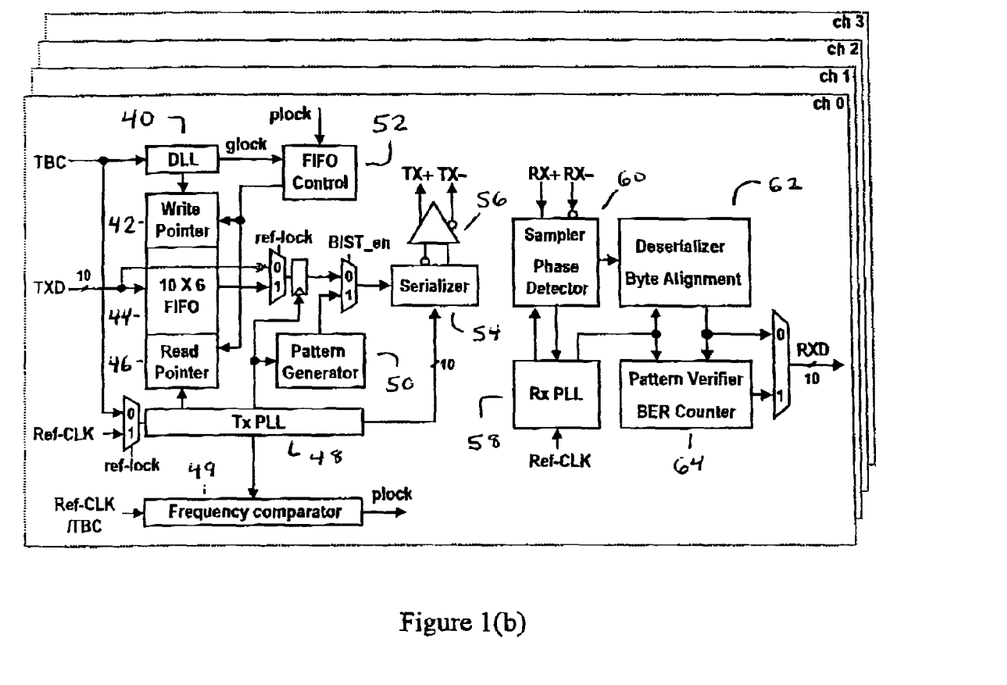
FIG. 1(b) is a transceiver block diagram with another reset from a frequency comparator.

As shown in FIG. 1(b), for jitter reduction, the Ref-CLK signal can be selected as the TxPLL input and then the FIFO circuit can resolve an uncertainty issue of the phase relationship between TXD and Ref-CLK. FIG. 1(b) shows a delay locked loop (DLL) 40, that is operatively connected to a write pointer 42, a 10×6 FIFO buffer 44, a read pointer 46, and a FIFO controller 52 on the transmitter side of the transceiver. Also shown are a transmitter phase locked loop (TxPLL) 48, a pattern generator 50, a serializer 54, and an output amplifier 56. In this embodiment the TxPLL 48 provides multiphase clocks to a serializer 54 and an additional clock to the other digital circuits. Also contained in FIG. 1(b) is a frequency comparator 49. In this mode, a delayed locked loop (DLL) 40 receives TBC and provides a clock to a write pointer of the FIFO 52, thereby maintaining synchronization with the internal circuit timing. The DLL 40 also provides a reset signal glock to a FIFO 52 control circuit. A frequency comparator 49 receives the TxPLL clock and Ref-CLK (or TBC) as the inputs, and provides another reset signal to the FIFO control circuit if the frequency difference between the two inputs is less than a predetermined value. Therefore, The FIFO circuit 52 does not require any external reset procedure unlike conventional circuits. A pattern generator 50 can provide one of a several kinds of patterns for a link test. Programmable pre-emphasis and amplitude controls are employed to offset the effects of skin loss and dispersion on a long transmission line. The receiver side is composed of a sampler and deadzone phase detector 60, an RxPLL 58, a deserializer and byte aligner 62, and a pattern verifier and a bit error rate (BER) counter 64.

Figure 2:
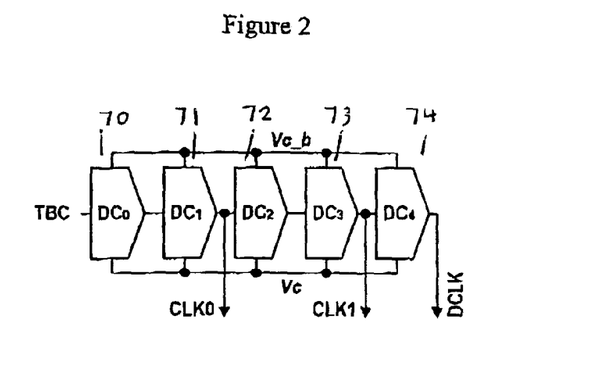
FIG. 2 is a block diagram showing components of a delay locked loop.

FIG. 2 shows the structure contained in the delay locked loop 40. The voltage-controlled delay line (VCDL) of the DLL 40 consists of five delay cells DC0, DC1, DC2, DC3, DC4 numbered 70-74 as shown. The delay cells are connected in a cascaded manner in order to maintain the quadruple phase relationship between the TBC and the DLL output clock (DCLK). An XOR type phase detector (PD) is employed to receive the output of the circuit shown in FIG. 2. The delay locked loop circuit also outputs 2 clock signals CLK0 and CLK1 which will be used in the circuit of FIG. 3.

Figure 3:
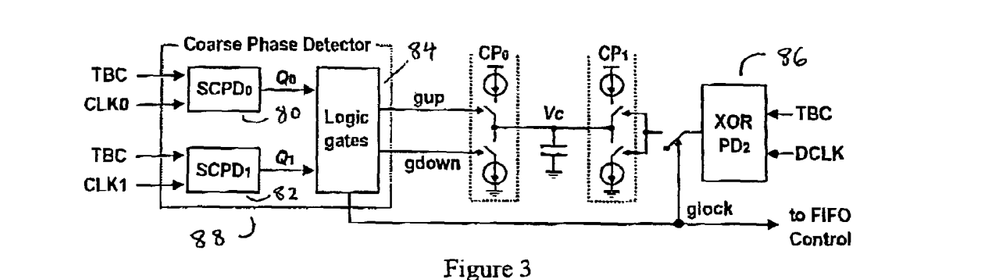
FIG. 3 is a block diagram showing components of a delay locked loop.
Figure 4:
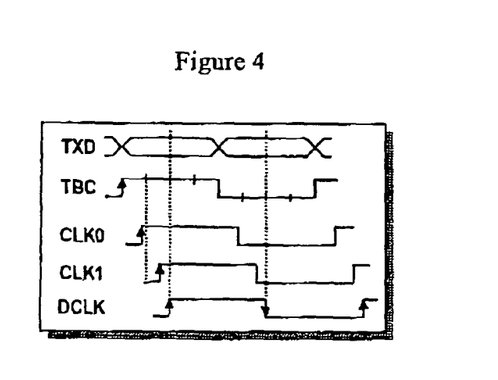
FIG. 4 is a timing diagram of the clock and data waveforms in a locked state.

FIG. 4 shows a timing diagram of the clock and data signals produced by FIGS. 2-3. With reference to FIG. 4, since both edges of the DCLK are located in the midpoints of the TXD eyes, DCLK is used as the writing clock of the FIFO 52. However, the XOR type phase detector exhibits only a 3× operating frequency range, which is not enough to overcome extreme PVT variations. So, a coarse phase detector (PD) having an 8.75× operating range is adopted.

Referring to FIG. 3, this circuit contains both a coarse phase detector 88 and a fine phase detector 86. The coarse phase detector 88 is comprised of logic gates 84 and 2 other internal phase detectors 80 and 82. At first, the coarse phase detector 88 forces the delay time of the VCDL toward the lock range. Once coarsely phase-locked, the control is transferred from the coarse phase detector 88 to the XOR type fine phase detector 86. This method allows the TBC, CLK0, and CLK1 signals to maintain the delay relationship as shown in FIG. 4. At this time, the glock activates the XOR type phase detector 86. Then, the XOR type phase detector 86 removes the residual phase error between the TBC and the DCLK. Due to the coarse and fine phase detectors, the DILL 40 works well in the whole frequency operating range without causing a stuck or a harmonic lock problem. The signal glock is then provided to the FIFO control circuit 52 as a reset signal.

Therefore the delay locked loop apparatus functions to provide a plurality of clock signals with appropriate delays. In summary the circuit 88 receives the reference signal, the first delayed signal, and the second delayed signal, and then adjusts the delay time so that a period of each delayed signal is within a predetermined range. The harmonic lock prevention is accomplished by the first current steering phase detector 80 which receives the reference signal and the first delayed signal and outputs a signal based on a state of the first delayed signal and the second current steering phase detector 82 which receives the reference signal and the second delayed signal and outputs a signal based on a state of the second delayed signal. The method further includes a delay time adjustment circuit to increase the delay time if the state of the first delayed signal is high, to decrease the delay time if the state of the second delayed signal is low, and to output a harmonic lock prevent signal if the state of the first signal is low and the state of the second signal is high. The delay locked loop further comprises a residual phase error correction circuit to receive the harmonic lock prevent signal and to correct a residual phase error in the delayed signals.

Another aspect of the present invention is the voltage controlled oscillator (VCO) contained in the phase locked loop (PLL) 48 as shown in FIG. 1(b). For the same tuning range of a VCO, as the supply voltage scales down with technology advancement, a VCO gain ($K_v$) grows larger. However, too large a $K_v$ induces detrimental problems in a PLL: a large jitter and a narrow pumping current range. For a realistic phase detector and charge pump design, the control voltage of a VCO is disturbed by parasitic currents due to coupling and charge sharing. Therefore a large $K_v$ induces a large jitter. Also, since the current range of a charge pump is inversely proportional to $K_v$, a large $K_v$ makes the pumping current range narrow, possibly causing instability in varying PVT conditions.

Figure 5A:
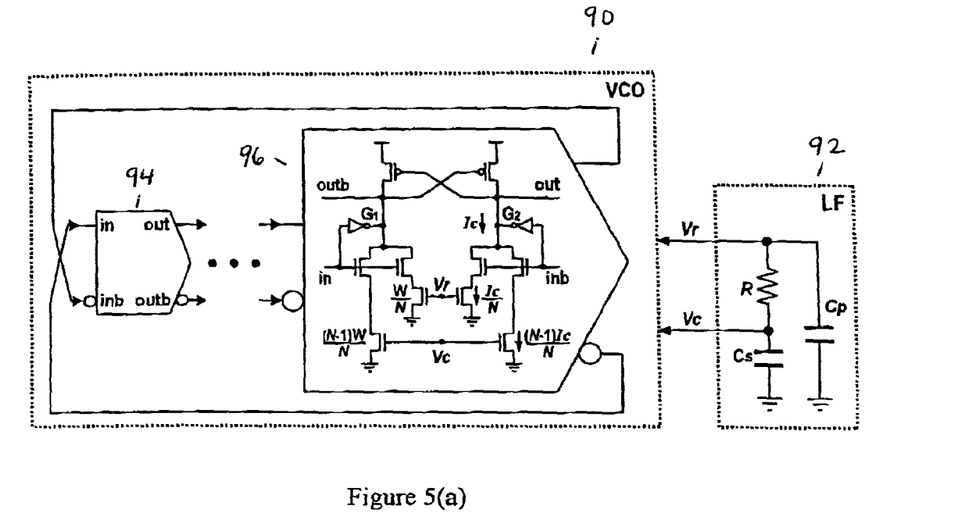
FIG. 5(a) is a folded starved inverter with dual current paths with a combined architecture of a VCO and low pass filter.

In order to meet both requirements of a low $K_v$ and a wide tuning range, a folded starved inverter with dual current paths is proposed with a combined architecture of a VCO and a loop filter (LF) as shown in FIG. 5(a). FIG. 5(a) shows a folded starved inverter circuit 90 and a low-pass filter network 92. Contained in the folded starved inverter 90 are cells 94 and 96. Contained within cell 96 are a cross-coupled PMOS pair included to sharpen the transition edges of the output waveform regardless of the delay time and to provide a differential generating output voltage. The inverters, $G_1$ and $G_2$, give more linearity to the VCO gain, and its positive supply-sensitivity compensates for the negative supply-sensitivity of the starved inverters. The other NMOS transistors are connected to perform input and control functions. To further reduce the effect of power supply fluctuation, a network 92 is added with resistors and capacitors to filter out the high frequency components of the supply and to provide a clean voltage to the gate of an NMOS source follower.

The current path of the original inverter is split to be a coarse-tracking path and a fine-tracking path. For a small variation $\Delta V$ of a VCO control voltage $V_r$, if the original cell current ($I_c$) varies by $\Delta I_c$, the proposed cell current will vary by $\Delta I_o/N$. The VCO gain is N times reduced to be $K_v/N$. The voltage $V_c$ of a capacitor $C_s$ filters out the high-frequency components of $V_r$, tracks its long-term average value, and functions as a coarse-tracking control voltage. Unlike a digitally-controlled coarse tracking scheme, where either a tuning range is limited by an immovable control or a large jitter is induced by an abrupt control-update, this analog scheme exhibits both seamless frequency acquisition and the uniform VCO-gain reduction ratio in the whole frequency range. Moreover, the analog coarse tracking is performed without resorting to additional circuits.

Figure 5B:
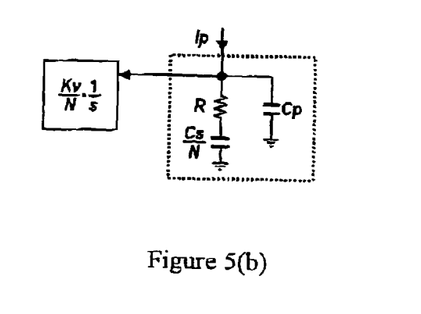
FIG. 5(b) is the equivalent linear model of the folded starved inverter with dual current paths with a combined architecture of a VCO and a low pass filter.

Since the currents of both the fine-tracking and coarse-tracking paths are linearly merged, the open-loop jitter transfer function of the PLL is equal to $$T(s) = \frac{I_p}{2\pi} \cdot \left(R + \frac{1}{sC_s}\right) \cdot \frac{K_v/N}{s} + \frac{I_p}{2\pi} \cdot \frac{1}{sC_s} \cdot \frac{(N-1)K_v/N}{s} = \quad (1)$$

$$\frac{I_p \cdot K_v \cdot \left(1 + \frac{RC_s \cdot s}{N}\right)}{2\pi C_s \cdot s^2} = \frac{I_p \cdot (K_v/N) \cdot \left(1 + \frac{s}{1/R \cdot (C_s/N)}\right)}{2\pi \cdot (C_s/N) \cdot s^2},$$

where $I_p$ is the charge pump current and $C_p$ is omitted for the simplicity. Both the effective VCO-gain and filter capacitance are N times reduced as shown in the equivalent linear model, FIG. 5(b). The loop gain becomes 1/N due to the $K_v$ reduction, which is also verified by a simulation. Therefore, an N-times $I_p$ range can be utilized. The zeros $N/RC_s$ is N times increased, possibly causing the lack of a phase margin.

Figure 5C:
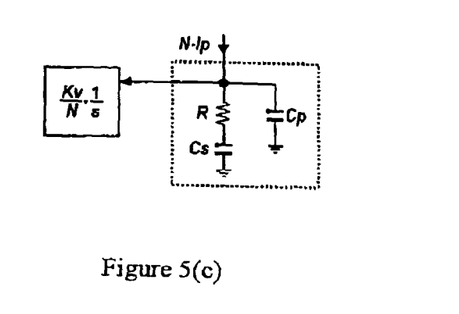
FIG. 5(c) is the converted linear model (by $N \times C_s$ and $N \times J_p$) of the folded starved inverter with dual current paths with a combined architecture of a VCO and a low pass filter.

However, if $C_s$ is N times enlarged, the zero returns to be the original value. If both $C_s$ and $I_p$ are N times enlarged, the whole transfer function become the same as the original one as follows:

$$T'(s) = \frac{I_p \cdot K_v \cdot \left(1 + \frac{s}{1/RC_s}\right)}{2\pi C_s \cdot s^2} \quad (2)$$

$$= T_o(s),$$

and as shown in FIGS. 5(b) and 5(c). Therefore, thanks to the $K_v$ reduction technique as described above, both low jitter performance and wide pumping current range can be obtained with the original operating range and PLL characteristics preserved. Also even if $C_p$ is considered, a similar result is obtained.

Figure 6:
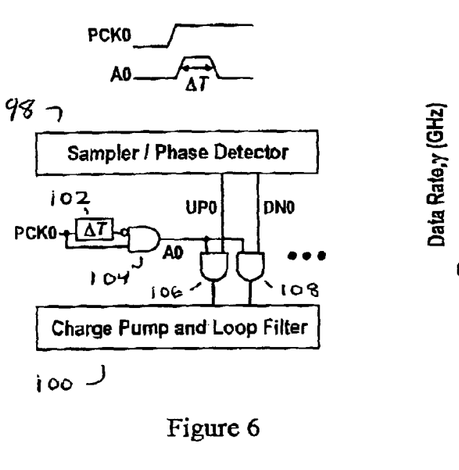
FIG. 6 shows the sampler/phase detector connection to the charge pump and loop filter.

FIG. 6 shows the connection of the sampler/phase detector to the charge pump and loop filter. The up and down signals from the sampler/phase detector 98 are fed through AND gates 106 and 108 into the loop filter 100. The AND gates also receive an input from AND gate 104. The inputs to gate 104 include the PCK0 signal and the PCK0 signal delayed by a time $\Delta T$ using delay circuit 102.

Figure 7:
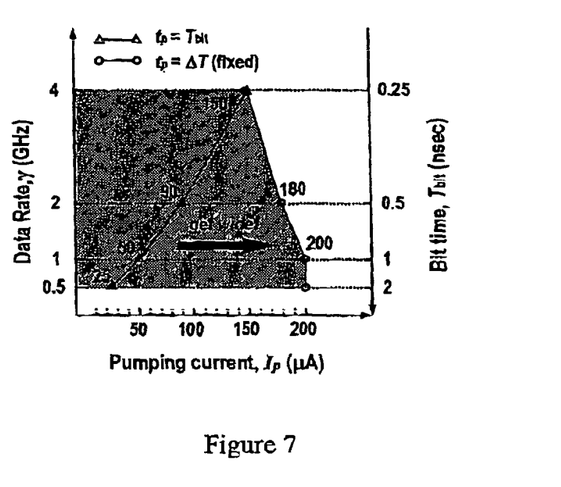
FIG. 7 illustrates pumping current ranges of $T_{bit}$ and $\Delta T$ charging-intervals.

FIG. 7 shows how the data rate varies as a function of pumping current. In a clock and data recovery (CDR) circuit, for every charge pumping with a pumping interval of $t_p$, the phase excursion of a CDR clock will be $\Delta\theta_o = K_v' \cdot J_p \cdot R \cdot t_p$, where $K_v'$ is an effective VCO gain, e.g. $K_v/N$ in the proposed VCO. If $t_p$ is equal to a bit time ($T_{bit}$), for the same $I_p$, the phase jitter gets larger with $T_{bit}$. In other words, for a predetermined phase jitter amount, the $I_p$ range gets narrower with $T_{bit}$ as show in FIG. 7. On the other hand, if $t_p$ is set to a fixed time ($\Delta T$), the $I_p$ range will be constant regardless of $T_{bit}$. Moreover, if $\Delta T$ is set to the least $T_{bit}$, e.g. 0.25 ns, the $I_p$ range will get wide in the whole data-rate range as shown in FIG. 7. In a realistic CDR design, due to a phase lag between phase detection and adjustment, the $I_p$ range is not constant but increases with $T_{bit}$ as shown. Since, in general, the PVT variations of both $K_v$ and $I_p$ are opposite to those of $\Delta T$, the PVT variations of both $K_v$ and $I_p$ compensate for those of $\Delta T$.

Figure 8:
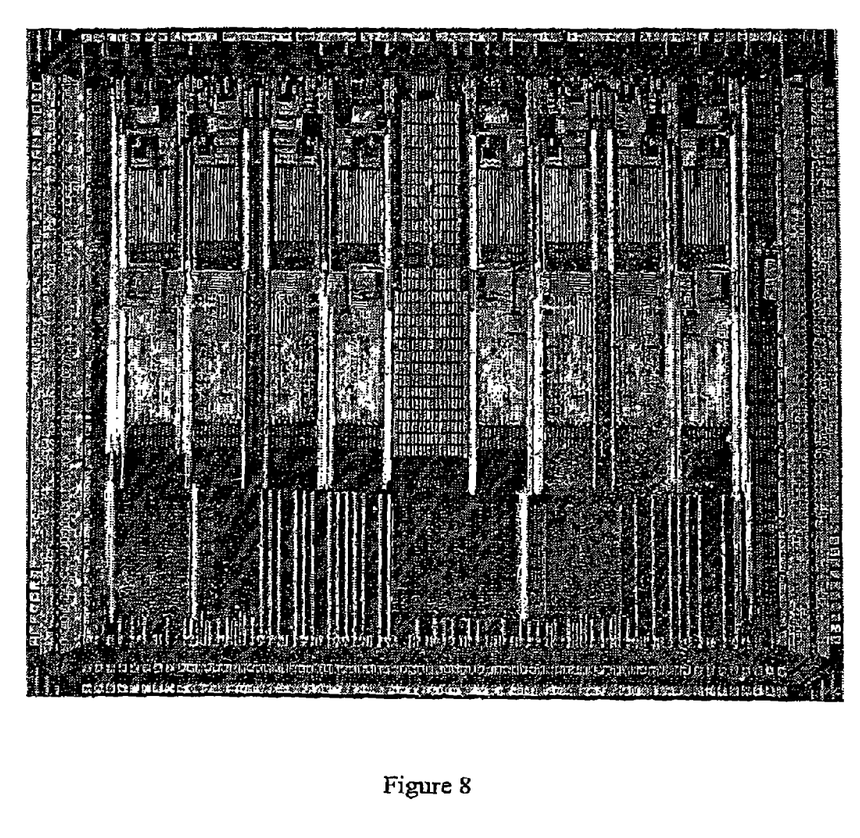
FIG. 8 is a chip microphotograph.

FIG. 8 shows the chip microphotograph. The prototype chip implemented in a 0.18-µm CMOS technology uses 324-pin PBGA package. The die size is 4.8×4.2 mm². With a 1.8-V core and 2.5-V I/O supply voltage, the transceiver operates at a data rate range of 0.6 to 3.2 Gbps. Measured recovered clock jitter is 80 ps pk-pk at 2.5 Gbps.

Figure 9A:
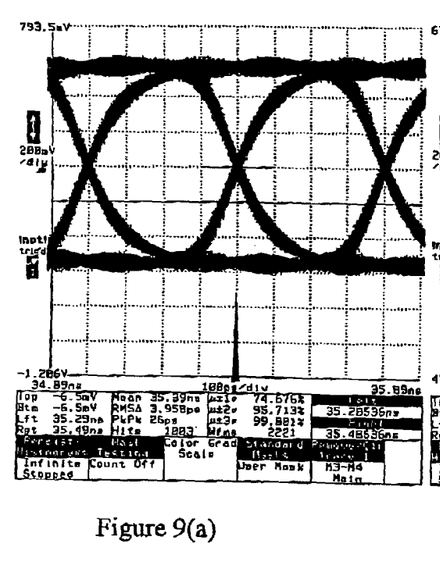
FIG. 9(a) is a transmitter (Tx) output eye diagram at 2.5 Gbps.
Figure 9B:
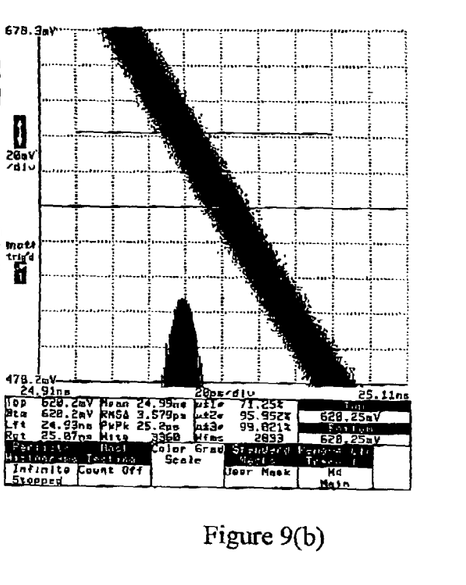
FIG. 9(b) is jitter histogram of a receiver PLL clock at 250 MHz.

FIG. 9(a) shows the Tx output eye diagram measured at 2.5 Gbps for an 8B/10B coded random pattern with 8 channels in both the local and remote transceivers all activated. The measured jitter is 3.96 ps rms and 26 ps pk-pk. FIG. 9(b) shows measured jitter histogram of a 250-MHz RxPLL clock, when locked to an input clock. The jitter is 3.58 ps rms and 25.2 pp. Up to 3 Gbps, the 8 channels show $10^{-12}$ BER. Especially, for all BER tests using over 100 test-pattern configurations at both 2.125 Gbps and 2.5 Gbps, no error are detected for more than 10 minutes ($<10^{-2}$). At 2.5 Gbps, the prototype chip except for I/O consumes around 580 mW.

Figure 10A:
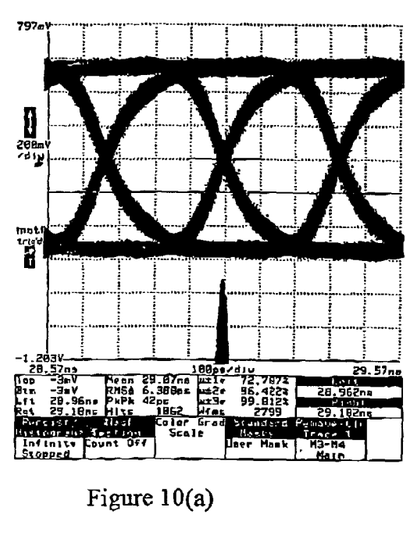
FIG. 10(a) is a transmitter (Tx) output eye diagrams at 3 Gbps with pre-emphasis off.
Figure 10B:
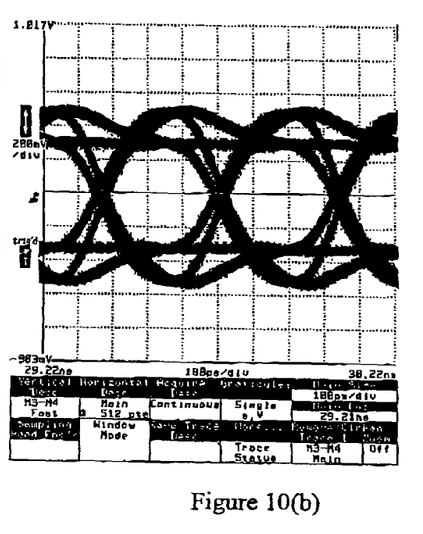

FIGS. 10(a) and 10(b) show the Tx output eye diagrams at 3 Gbps with pre-emphasis off and medium pre-emphasis on. Table 1 summarizes the measured performance of the transceiver.

TABLE I

Performance characteristics of prototype chip

| | |
|---|---|
| Process | 0.18 μm N-well 4-metal CMOS process |
| Supply voltage | 1.8 V (core), 2.5 V (I/O) |
| Data rate range | 0.6-3.2 Gbps |
| Area | 4.8 × 4.2 mm² |
| Power dissipation (1.8-V core) | 104 (mW/Gbps) × Data rate + 320 (mW) (580 mW for 4 channels @ 2.5 Gbps) |
| Accumulated Jitter of Tx data (with link activated) | 3.96 ps RMS/26 ps pk-to-pk (@ 2.5 Gbps) 6.39 ps RMS/42 ps pk-to-pk (@ 3 Gbps) |
| Accumulated Jitter of RxPLL (locked to in-clk) | 3.58 ps RMS/25.2 ps pk-to-pk (@ 2.5 Gbps) 4.23 RMS/29.2 ps pk-to-pk (@ 3 Gbps)) |
| BER | $<10^{-12}$ for over 100 test-pattern configurations (@ 2.5 Gbps & 2.125 bps) |
| Output Amplitude | 1-V pk-to-pk differential (nominal) |

It will therefore be appreciated that the present invention includes a number of aspects. In one aspect, the invention includes an integrated circuit including digital electronic circuitry, and a transceiver coupled to the digital electronic circuitry having a voltage controlled oscillator having a plurality of current paths. Preferably, the transceiver is a CMOS transceiver. In another aspect, a method for operating a transceiver includes providing a transceiver port and a voltage controlled oscillator coupled to the port, where the voltage controlled oscillator has at least two current paths.

These and other aspects, permutations and equivalents will become apparent to those skilled in the art upon a study of the various Figures of the drawing and a review of the preceding examples.

The invention claimed is:

1. A quad-channel transceiver comprising:
    a phase locked loop circuit including a voltage controlled oscillator used to generate a clock signal;
    a FIFO buffer used to store data to be transmitted;
    a frequency comparator for comparing a reference clock to the generated clock signal from the phase locked loop circuit; and
    a folded starved inverter circuit contained within the voltage controlled oscillator, the folded starved inverter circuit provides two current paths and contains four transistors connected to provide the folded starved inverter circuit, wherein two of the four transistors provide an input connection, and two of the four transistors provide a current controlling function.

2. The quad-channel transceiver of claim 1 wherein the transceiver further comprises a FIFO buffer control circuit.

3. The quad-channel transceiver of claim 1 wherein the transceiver further comprises a delay locked loop.

4. The quad-channel transceiver of claim 3 wherein the delay locked loop further comprises a coarse phase detector and a fine phase detector.

5. The quad-channel transceiver of claim 4 wherein the delay locked loop sends a signal to a FIFO buffer control circuit.

6. A quad-channel transceiver comprising:
    a phase locked loop circuit including a voltage controlled oscillator used to generate a clock signal;
    a FIFO buffer used to store data to be transmitted;
    a frequency comparator for comparing a reference clock to the generated clock signal from the phase locked loop circuit;
    a folded starved inverter circuit and a low pass filter network contained within the voltage controlled oscillator; and
    the low pass filter network comprises two capacitors and one resistor.

7. The quad-channel transceiver of claim 6 wherein the folded starved inverter circuit provides a coarse tracking current path and a fine tracking current path, and the coarse tracking current path and fine tracking current path are linearly merged.

8. A method for operating a quad-channel transceiver comprising:
    providing data to be transmitted into a FIFO buffer;
    providing clock signals using a phase locked loop and voltage controlled oscillator circuits;
    providing a plurality of delayed clock signals; and
    transmitting data using clock signals produced from a folded starved inverter circuit contained within the voltage controlled oscillator circuit;
    wherein the folded starved inverter circuit contains two current paths and contains four transistors connected to provide the folded starved inverter circuit, wherein two of the four transistors provide an input connection, and two of the four transistors provide a current controlling function.

9. The method for operating a quad-channel transceiver of claim 8 wherein the plurality of delayed clock signals are provided by a delay locked loop.

10. The method for operating a quad-channel transceiver of claim 9 wherein the delay locked loop further comprises a coarse phase detector and a fine phase detector.

11. A quad-channel transceiver comprising:
    a phase locked loop circuit including a voltage controlled oscillator used to generate a clock signal;
    a FIFO buffer used to store data to be transmitted by a quad-channel transmitter component within the quad-channel transceiver; and
    a frequency comparator for comparing a reference clock to the generated clock signal from the phase locked loop circuit;
    the voltage controlled oscillator further including:
        (i) a folded starved inverter circuit that includes two current paths and that provides a coarse tracking current path and a fine tracking current path that are linearly merged;
        (ii) at least two transistors cross-coupled to provide a differential output stage; and
        (iii) a low pass filter network including at least two capacitive elements and at least one resistive element.

12. A quad-channel transceiver as in claim 11, wherein the quad-channel transceiver comprises a quad-channel transmitter.

13. A method for operating a quad-channel transceiver comprising:
- providing data to be transmitted by a quad-channel transmitter component of the quad-channel transceiver into a FIFO buffer;
- generating clock signals using a phase locked loop and voltage controlled oscillator circuits;
- generating a plurality of delayed clock signals using at least one delay locked loop circuit, the at least one delay locked loop circuit including a coarse phase detector detecting a coarse phase and a fine phase detector detecting a fine phase; and
- transmitting data from the quad-channel transmitter component within the quad-channel transceiver using clock signals produced from a folded starved inverter circuit contained within the voltage controlled oscillator circuit providing two current paths and including four transistors wherein two of the four transistors provide a current controlling function and further providing a coarse tracking current path and a fine tracking current path that are linearly merged.

* * * * *